(12) United States Patent
Farr (10) Patent No.: US 11,095,270 B2
(45) Date of Patent: Aug. 17, 2021

(54) METHOD FOR AVERAGING PULSATING MEASUREMENT QUANTITIES

(71) Applicant: Robert Bosch GmbH, Stuttgart (DE)

(72) Inventor: Thomas Farr, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 402 days.

(21) Appl. No.: 16/201,374

(22) Filed: Nov. 27, 2018

(65) Prior Publication Data
US 2019/0165766 A1 May 30, 2019

(30) Foreign Application Priority Data

Nov. 30, 2017 (DE) ...................... 10 2017 221 576.3

(51) Int. Cl.
| | |
|---|---|
| *H03H 17/02* | (2006.01) |
| *G01D 9/00* | (2006.01) |
| *G01L 19/00* | (2006.01) |
| *G05B 15/02* | (2006.01) |
| *G01F 3/00* | (2006.01) |
| *G01F 15/075* | (2006.01) |
| *G01F 1/72* | (2006.01) |

(52) U.S. Cl.
CPC .......... *H03H 17/026* (2013.01); *G01D 9/005* (2013.01); *G01F 1/72* (2013.01); *G01F 3/00* (2013.01); *G01F 15/0755* (2013.01); *G01L 19/00* (2013.01); *G05B 15/02* (2013.01)

(58) Field of Classification Search
CPC ...... H03H 17/026; G01D 99/005; G01F 1/72; G01F 3/00; G01F 15/0755; G01L 19/00; G05B 15/02
See application file for complete search history.

(56) References Cited

U.S. PATENT DOCUMENTS

| | | | | |
|---|---|---|---|---|
| 4,457,167 | A * | 7/1984 | Sumal | G01F 1/72 73/114.32 |
| 4,669,301 | A * | 6/1987 | Kratt | G01F 1/72 73/114.34 |
| 5,069,063 | A * | 12/1991 | Chrobaczek | G01D 3/02 73/114.26 |
| 5,646,344 | A * | 7/1997 | Konzelmann | F02D 41/045 73/204.18 |
| 2004/0097814 | A1 * | 5/2004 | Navakatikyan | G06K 9/0053 600/485 |

(Continued)

FOREIGN PATENT DOCUMENTS

DE 102014225176 6/2016

*Primary Examiner* — Raymond L Nimox
(74) *Attorney, Agent, or Firm* — Michael Best & Friedrich LLP (57) ABSTRACT

A method for averaging pulsating measurement quantities is disclosed. First, time-discrete measurement values (1) of the measurement quantity are recorded. Subsequently, first filtering of the measurement values (1) is carried out with a first filter time constant, during which a first signal (2) is obtained, and second filtering of the measurement values (1) with a second filter time constant, during which a second signal (3) is obtained, the second filter time constant being greater than the first filter time constant. Intersection points (4), at which the first signal (2) and the second signal (3) intersect, are then determined. Lastly, the arithmetic mean of the measurement values (1) between the intersection points (4) is taken.

20 Claims, 9 Drawing Sheets

(56) References Cited

U.S. PATENT DOCUMENTS

2006/0224298 A1* 10/2006 Lang .................... G01F 1/72
                                                701/114
2014/0208871 A1*  7/2014 Hays ................. G01F 1/8418
                                                73/861.355

* cited by examiner

METHOD FOR AVERAGING PULSATING MEASUREMENT QUANTITIES

BACKGROUND OF THE INVENTION

The present invention relates to a method for averaging pulsating measurement quantities. The invention furthermore relates to a computer program which carries out each step of the method when it runs on a computing device, and to a machine-readable storage medium which stores the computer program. Lastly, the invention relates to an electronic control device which is adapted to carry out the method according to the invention.

Pulsating measurement quantities are measurement quantities on which a periodic variation is superimposed, and usually occur when system components act periodically on a measurement quantity. The measurement quantities are recorded as measurement values and for example used for control or regulation of the system, in particular of the component, by means of an electronic control device. For control or regulation of the system by means of the electronic control device, however, it is preferable to use average values of the measurement quantities over a pulsation period. Currently, the averaging is carried out with the aid of external features, which are typically recorded by an additional sensor.

One example of such a component is an intake system of a 4-stroke engine, in which an air mass flow rate into the engine is used as a measurement quantity. The air mass flow rate has pulsations which result from the stroke of the engine. The ignition frequency of the 4-stroke engine is used as an external feature for the averaging.

A further example is a diaphragm pump in a delivery and dosing system. In this case, the system pressure is used as a measurement quantity, for which no external feature can be found. The averaging is then carried out, for example, with a PT1 filter having a fixed filter time constant.

SUMMARY OF THE INVENTION

A method for averaging pulsating measurement quantities is provided. Pulsating measurement quantities are measurement quantities which are subject to periodic variations. The method comprises the following steps:

Time-discrete measurement values of the pulsating measurement quantity in question are recorded, i.e. measurement values of the measurement quantity are recorded at fixed times, which may in particular be equidistant from one another. The measurement values pass through two different filterings with different filter time constants. In this case, a first filter time constant is greater than a second filter time constant. First filtering of the measurement values is carried out with the first filter time constant, and a first signal is obtained, which follows the measurement values more rapidly because of the smaller first filter time constant (fast signal). Second filtering of the measurement values is carried out with the second filter time constant, and a second signal is obtained, which follows the measurement values more slowly because of the larger second filter time constant (slow signal).

Subsequently, intersection points are determined, at which the first signal and the second signal intersect. Within a period of the pulsating measurement quantity, two such intersection points of different types may be determined, specifically on the one hand when the first signal is increasing when it intersects the second signal, and on the other hand when the first signal is decreasing when it intersects the second signal. Each type of intersection point is repeated periodically with the same period as the measurement quantity. The intersection points of different types alternate after one half-period of the pulsating measurement quantity.

The start and the end of the period are given by the intersection points of the same type between the first and second signal. The period of the pulsating measurement quantity is consequently determined from the time difference of the intersection points. If the pulsation has been caused by a rotating component, the rotational speed of the rotating component may be determined by forming the inverse from the period which has been determined. The period and/or rotational speed determined in this way may be used for monitoring and/or regulation of the component in question.

Lastly, an arithmetic mean of the measurement values may be formed between the intersection points. The average values are determined at the intersection points and take into account the preceding measurement values. For the case in which both types of intersection points are determined, the average value is always formed between intersection points of the same type. In other words, one average value is formed between the intersection points at which the first signal is decreasing when it intersects the second signal, over the full period, and a further average value is formed between the intersection points at which the first signal is increasing when it intersects the second signal, likewise over the full period. In a similar way as when averaging with the aid of an external feature, the average values indicate the dynamic range of the measurement quantity over one half-period. Since only the measurement values of the measurement quantity are measured for this method, an additional sensor (for example for determining an external feature) may be obviated.

When both types of intersection points are used, one intersection point may already be determined after one half-period of the pulsating measurement quantity, and the average value can be formed over the preceding full period. This is particularly advantageous with a view to regulation of the measurement quantity, since a phase lag of the regulation is reduced and the stability and the dynamic range of the regulation are therefore increased.

According to one aspect, provision may be made to determine only intersection points at which the first signal is decreasing and intersects the second signal. According to another aspect, provision may be made to determine only intersection points at which the first signal is increasing and intersects the second signal. In both cases, the time difference of neighboring intersection points corresponds exactly to the period of the pulsating measurement quantity. The termination of the respective one type of intersection point for only one edge is advantageous particularly when the respective other edge of the periodic measurement values has (additional) perturbation.

If, as described above, both types of intersection point are determined, provision may preferably be made that a further arithmetic mean is formed between the average values of the intersection points at which the first signal is decreasing and the average values of the intersection points at which the first signal is increasing. By this additional averaging of the average values of the two types of intersection points, errors which result in particular from the time-discrete determination of the measurement values are compensated for and thereby reduced. These time errors are usually +/−1 time interval of the time-discrete recording of the measurement values (sampling).

Furthermore, provision may be made to record at least ten measurement values during a pulsation of the measurement quantity during the recording of the time-discrete measurement values. The greater the number of measurement values is, the less effect a time error has when averaging the measurement values, and the more accurate the average values determined become.

Advantageously, a linear interpolation of the first signal and the second signal may be carried out during the determination of the intersection points. In this way, values of the signals may be filled in even in regions in which no signal value has been determined because of the filterings. Consequently, intersection points may also be determined between the signal values of the two signals, so that the aforementioned time error can be reduced and the period can be indicated more accurately.

Furthermore, an error in the average values may be reduced directly by interpolation. A method for correcting the average value with a correction quantity is known from DE 10 2014 225 176 A1.

As a filter, a PT1 element may preferably be used, for example a $1^{st}$ order lowpass. The relations mentioned below are suitable for the filter time constants:

Advantageously, the cutoff frequency of the first filtering is about two times the frequency of the pulsation of the measurement quantity. Yet since the frequency of the pulsation—or more precisely the period from which the frequency may be determined—is only determined precisely in the course of the method, an estimated frequency may be used for determining the parameters for the filterings. The estimated frequency may be derived from the operating parameters of the generator of the measurement quantity and/or from a model. Thus, according to Formula 1, the following preferred value is obtained for the first filter time constant Ti as a function of the (estimated) frequency $f_p$ of the pulsation:

$$\tau_1 = \frac{1}{4\pi \cdot f_p} \quad \text{(Formula 1)}$$

Furthermore, the second filter time constant is advantageously approximately four times the first filter time constant. Thus, according to Formula 2, the following preferred value is obtained for the second filter time constant $\tau_2$ as a function of the (estimated) frequency $f_p$ of the pulsation:

$$\tau_2 = \frac{1}{\pi \cdot f_p} \quad \text{(Formula 2)}$$

With this ratio, it is possible even to record the actual pulsation frequencies which differ significantly—up to a factor of less than 10—from the estimated frequency of the pulsation.

Furthermore, an error may be detected when two neighboring average values of the same type differ significantly from one another, i.e. when one of the two average values does not lie in a predeterminable value range around the other average value.

The computer program is adapted to carry out each step of the method, in particular when it is run on a computing device or control device. It makes it possible to implement the method in a conventional electronic control device, without structural modifications having to be carried out thereon. To this end, it is stored on the machine-readable storage medium.

By running the computer program on a conventional electronic control device, the electronic control device which is adapted to carry out the averaging of the pulsating measurement quantities is obtained.

BRIEF DESCRIPTION OF THE DRAWINGS

Exemplary embodiments of the invention are represented in the drawings and explained in more detail in the following description.

DETAILED DESCRIPTION

Figure 1:
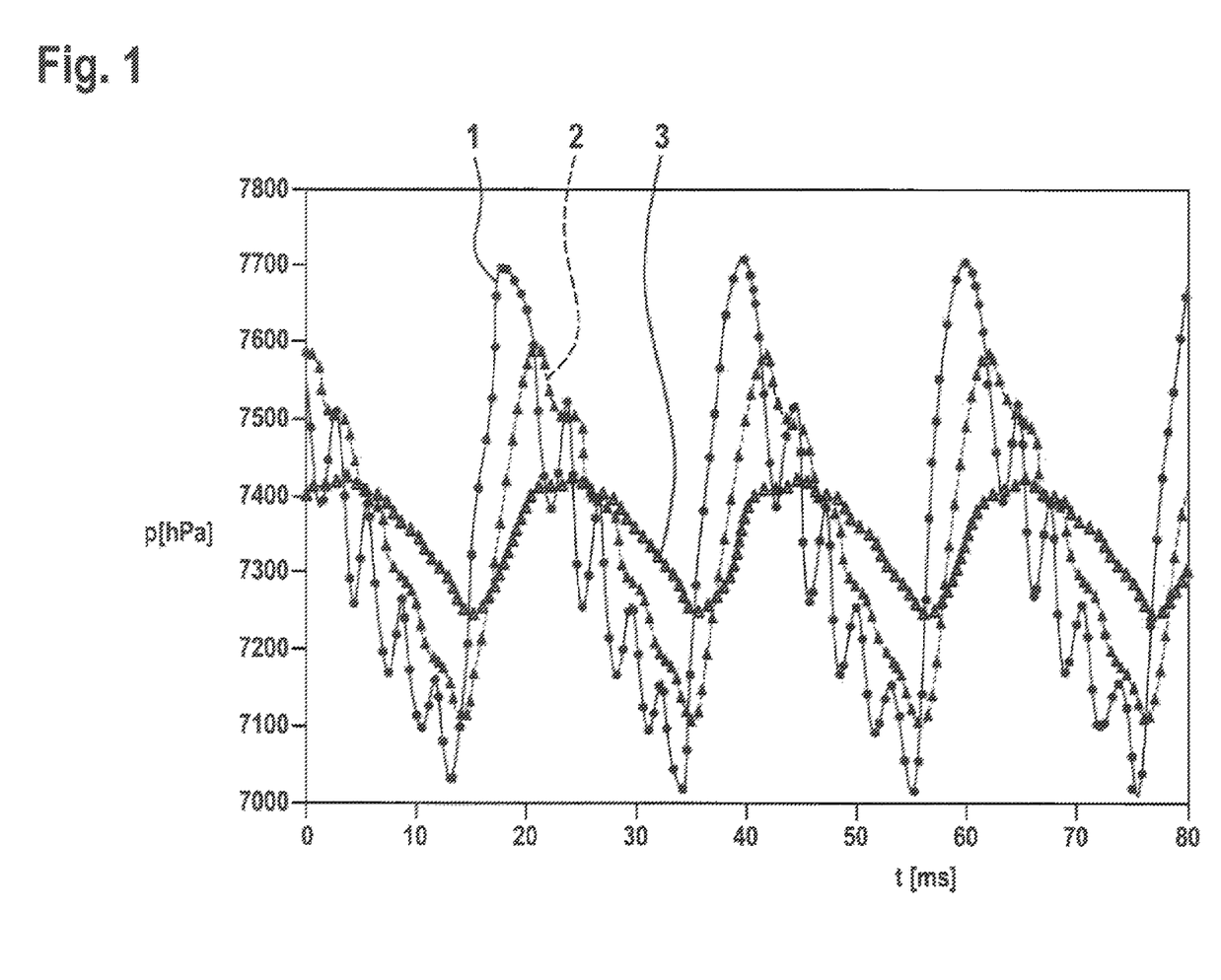
FIG. 1 shows a diagram of measurement values and of a first and a second filtered signal of a pressure as a measurement quantity as a function of time.
Figure 1A:
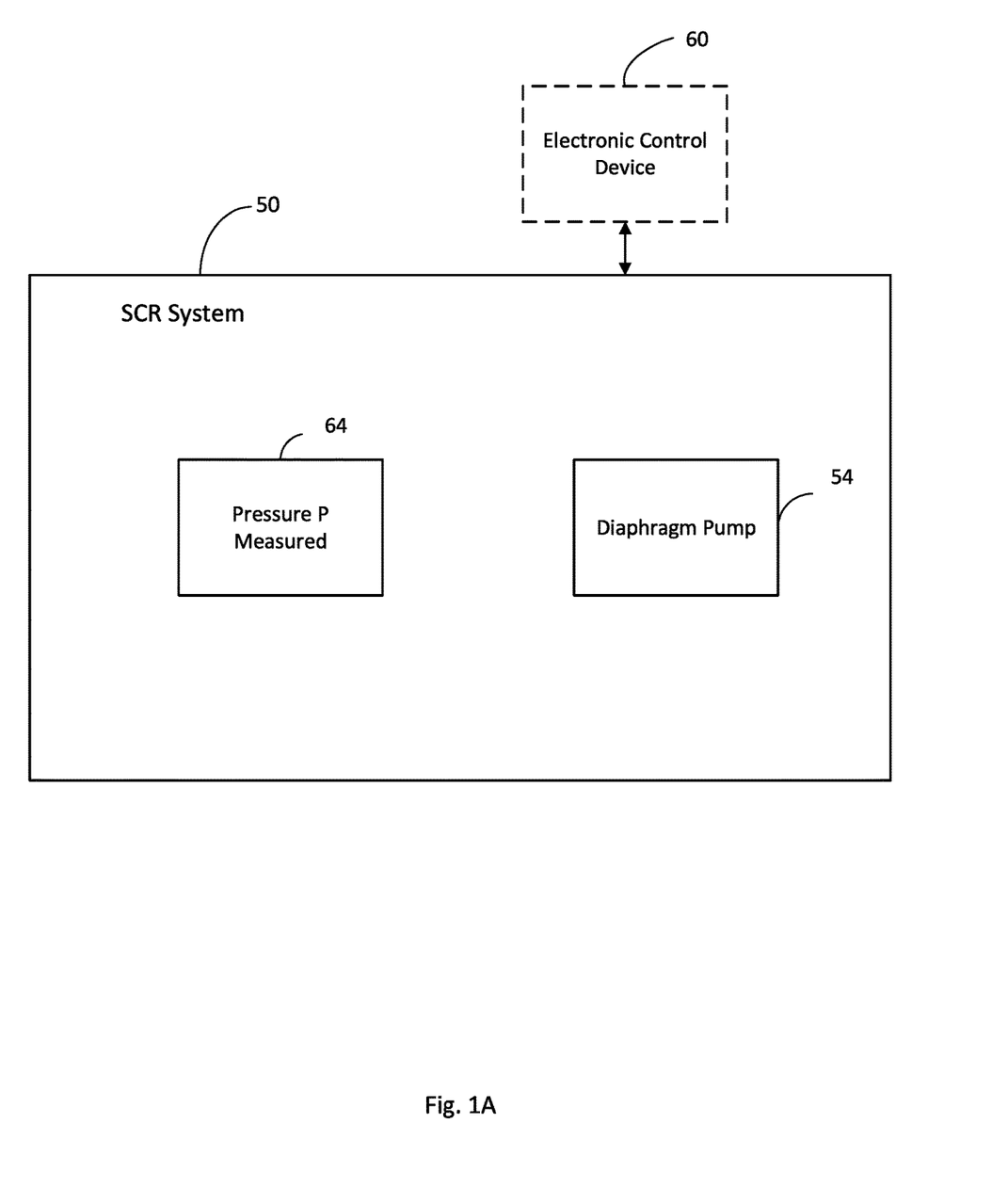
FIG. 1A shows a block diagram of a SCR system.

FIG. 1 shows a diagram of a pressure p, which has been measured as a measurement quantity in an SCR (selective catalytic reduction) system 50 shown in FIG. 1A having a diaphragm pump 54 as a function of time t and an electronic control device 60. Measurement values 1 of the pressure p were recorded time-discretely according to one embodiment of the method according to the invention with a sampling rate of 1 ms and are plotted in the diagram. The pressure p represented is the pressure actually measured 64 as shown in FIG. 1A. Ideally, this pressure would be constant, and would in particular not be influenced by dosing activities. Because of the limited hydraulic volume of the system in conjunction with its stiffness, however, unintended pressure variations occur because of dosing activities. If these dosing activities occur periodically, for example with a period of 1 s, the average value of the pressure likewise varies with this period. For the diaphragm pump, the pulsation may be derived from the operating parameters and/or from a model of an estimated frequency $f_p$. From the estimated frequency $f_p$, a first filter time constant $\tau_1$ for first filtering of the measurement values 1 may be determined by means of the already known Formula 1, and a second filter time constant $\tau_2$ for second filtering of the measurement values 1 may be determined by means of the likewise already known Formula 2:

$$\tau_1 = \frac{1}{4\pi \cdot f_p} \quad \text{(Formula 1)}$$

$$\tau_2 = \frac{1}{\pi \cdot f_p} \quad \text{(Formula 2)}$$

The second filter constant $\tau_2$ is in this case four times the first filter time constant $\tau_1$. A (rapid) first signal 2 resulting from the first filtering and a (slow) second signal 3 resulting from the second filtering are likewise represented in FIG. 1.

Figure 2:
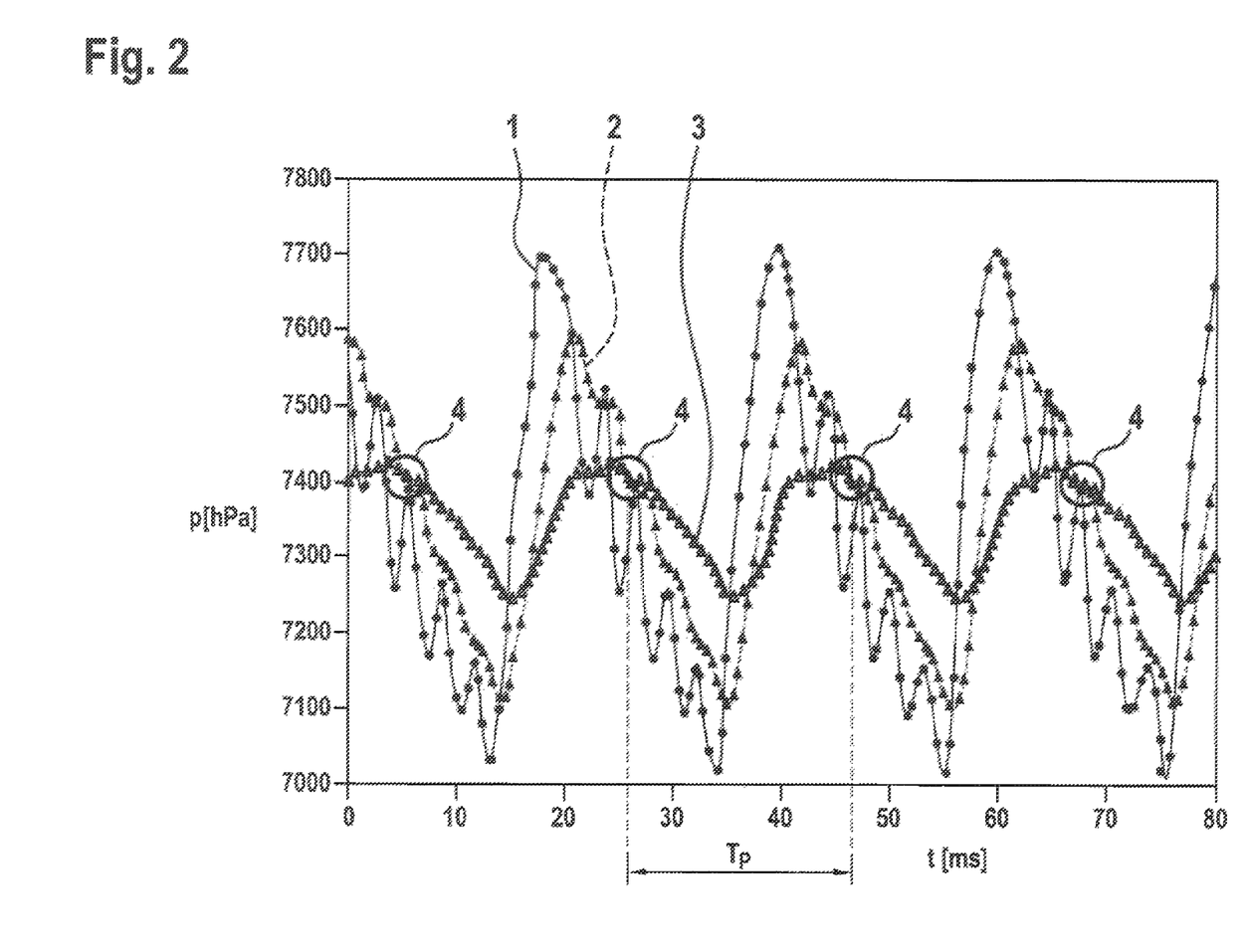
FIG. 2 shows, in the diagram of FIG. 1, intersection points which have been determined according to a first embodiment of the method according to the invention.
Figure 3:
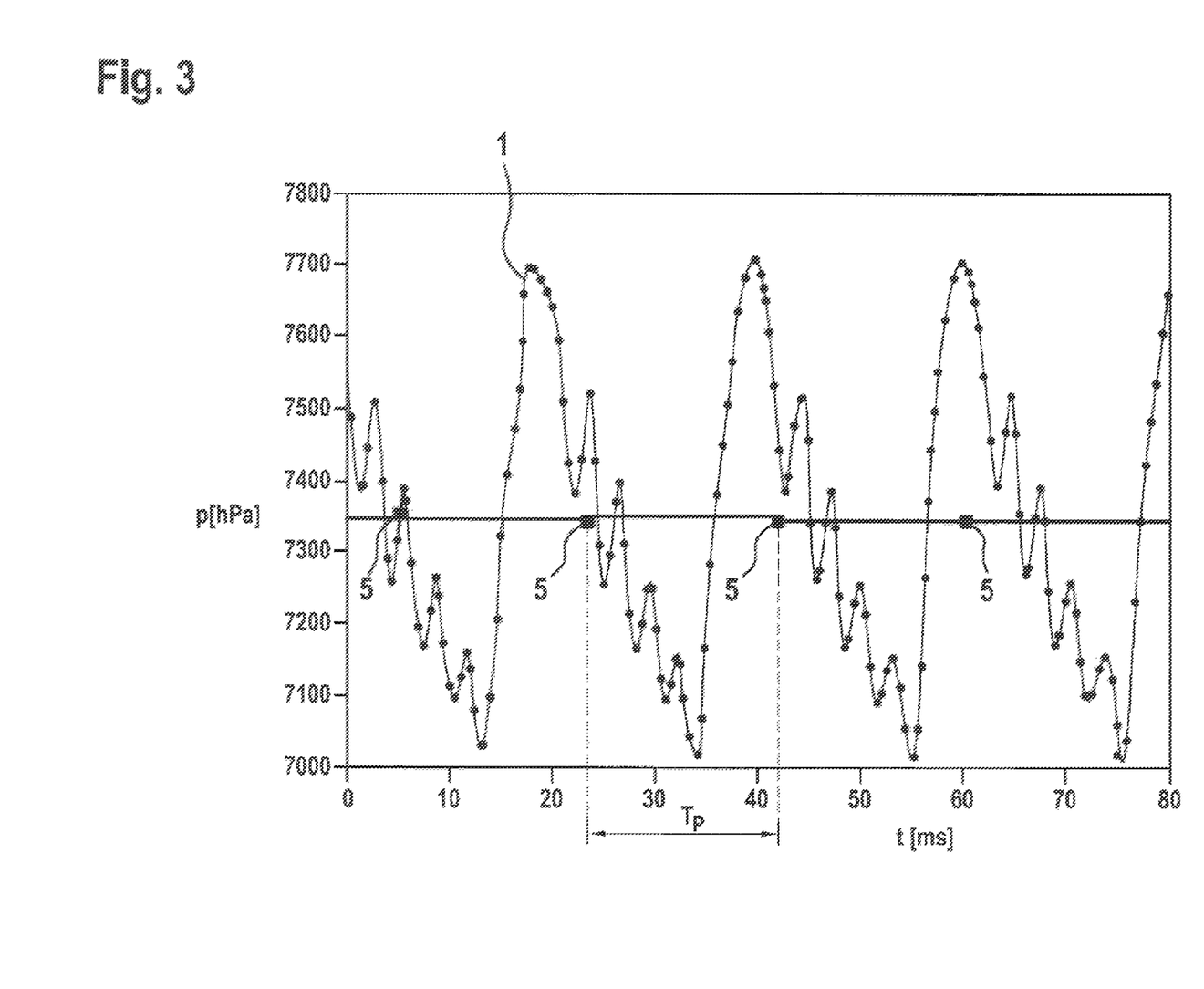
FIG. 3 shows, in a diagram of the pressure as a function of time, the measurement values from FIG. 1 and intersection measurement values for the intersection points of FIG. 3, as well as average values according to a first embodiment of the method according to the invention.

FIG. 2 shows, in the diagram of FIG. 1, a first embodiment of the method according to the invention in which intersection points 4 are determined at which the first signal 2 is decreasing and intersects the second signal 3. The time difference between two neighboring intersection points 4 corresponds to the period $T_P$ of the pulsation. In this exemplary embodiment, the period $T_P$ is about 20 ms. If the inverse of the period $T_P$ is formed, the rotational speed of the diaphragm pump may be determined therefrom. The diaphragm pump may then be monitored and/or regulated by means of this period and/or the rotational speed. The arithmetic mean of those measurement values 1 which lie between the intersection points 4 is taken at the subsequent intersection point 4. Besides the measurement values 1, FIG. 3 shows the periodic average values 5 determined in this way. As already described, the periodic average values 5 are determined at the intersection points 4 and take into account the preceding measurement values 1. The periodic average values 5 therefore only change at the intersection points 4, and therefore reflect the dynamic range of the measurement values 1 delayed by one half-period. The average values 5 in this case lie in a narrow value range around 7350 hPa, from which it may be concluded that the diaphragm pump is operating error-free.

Figure 4:
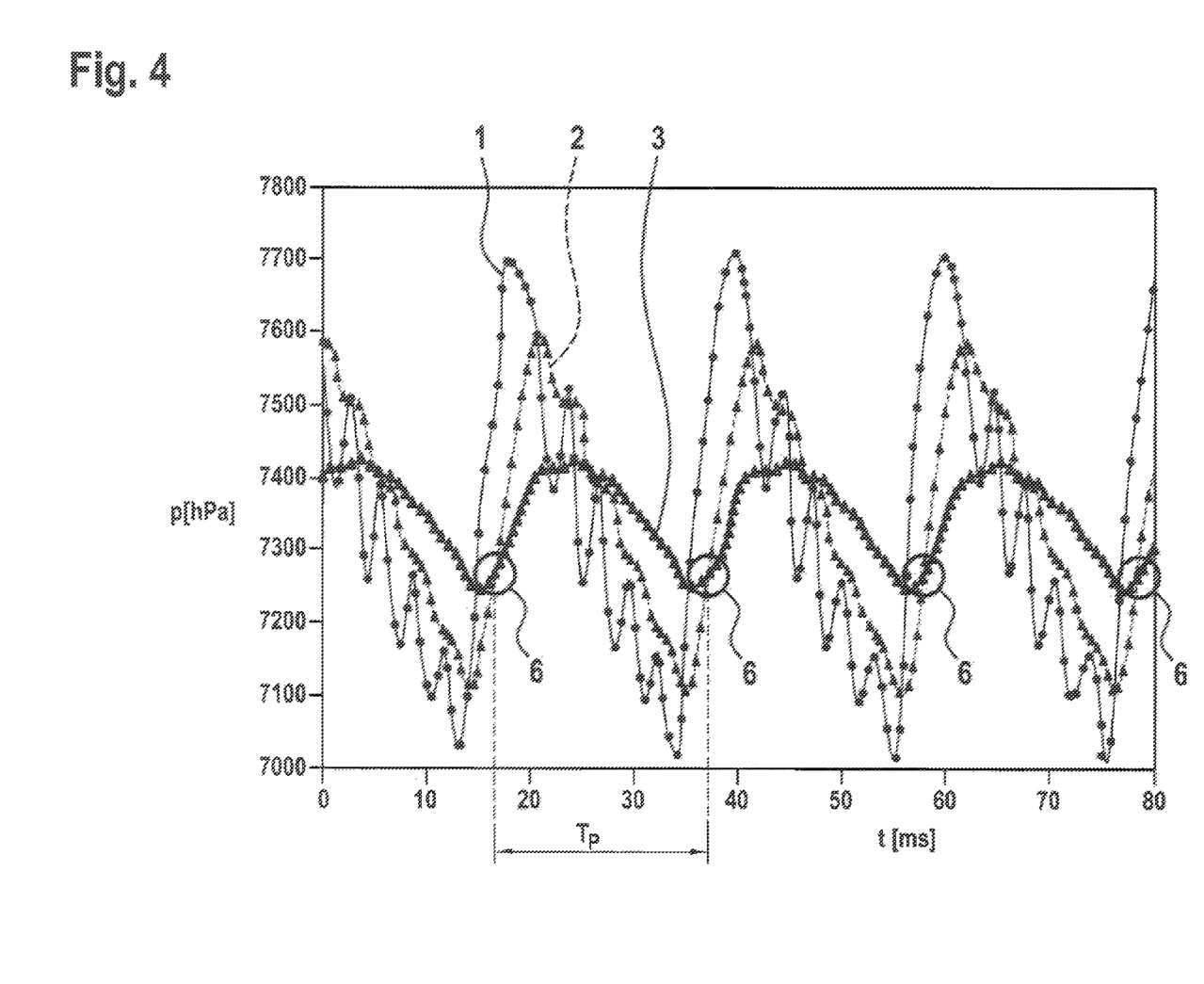
FIG. 4 shows, in the diagram of FIG. 1, intersection points which have been determined according to a second embodiment of the method according to the invention.
Figure 5:
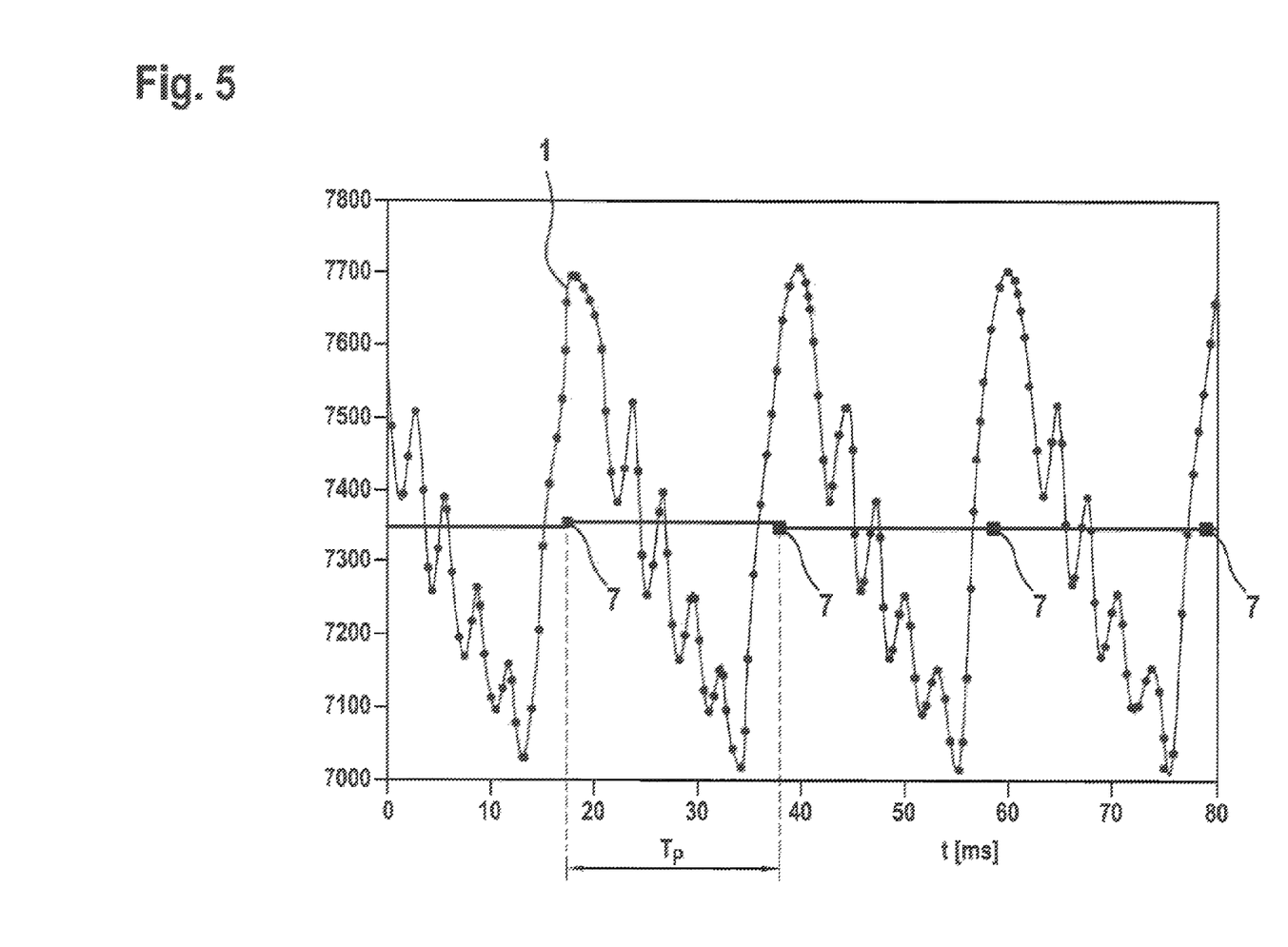
FIG. 5 shows, in a diagram of the pressure as a function of time, the measurement values from FIG. 1 and intersection measurement values for the intersection points of FIG. 4, as well as average values according to a second embodiment of the method according to the invention.

FIG. 4 shows, in the diagram of FIG. 1, a second embodiment of the method according to the invention in which intersection points 6 are determined at which the first signal 2 is increasing and intersects the second signal 3. Similarly, the time difference between two neighboring intersection points 6 corresponds to the period $T_P$ of the pulsation. The arithmetic mean of those measurement values 1 which lie between the intersection points 6 is taken at the subsequent intersection point 6. Besides the measurement values 1, FIG. 5 shows the periodic average values 7 determined in this way. Here again, as already described, the periodic average values 7 are determined at the intersection points 6 and take into account the preceding measurement values 1. The periodic average values 7 in this case likewise lie in a narrow value range around 7350 hPa, from which it may be similarly concluded that the diaphragm pump is operating error-free.

Figure 6:
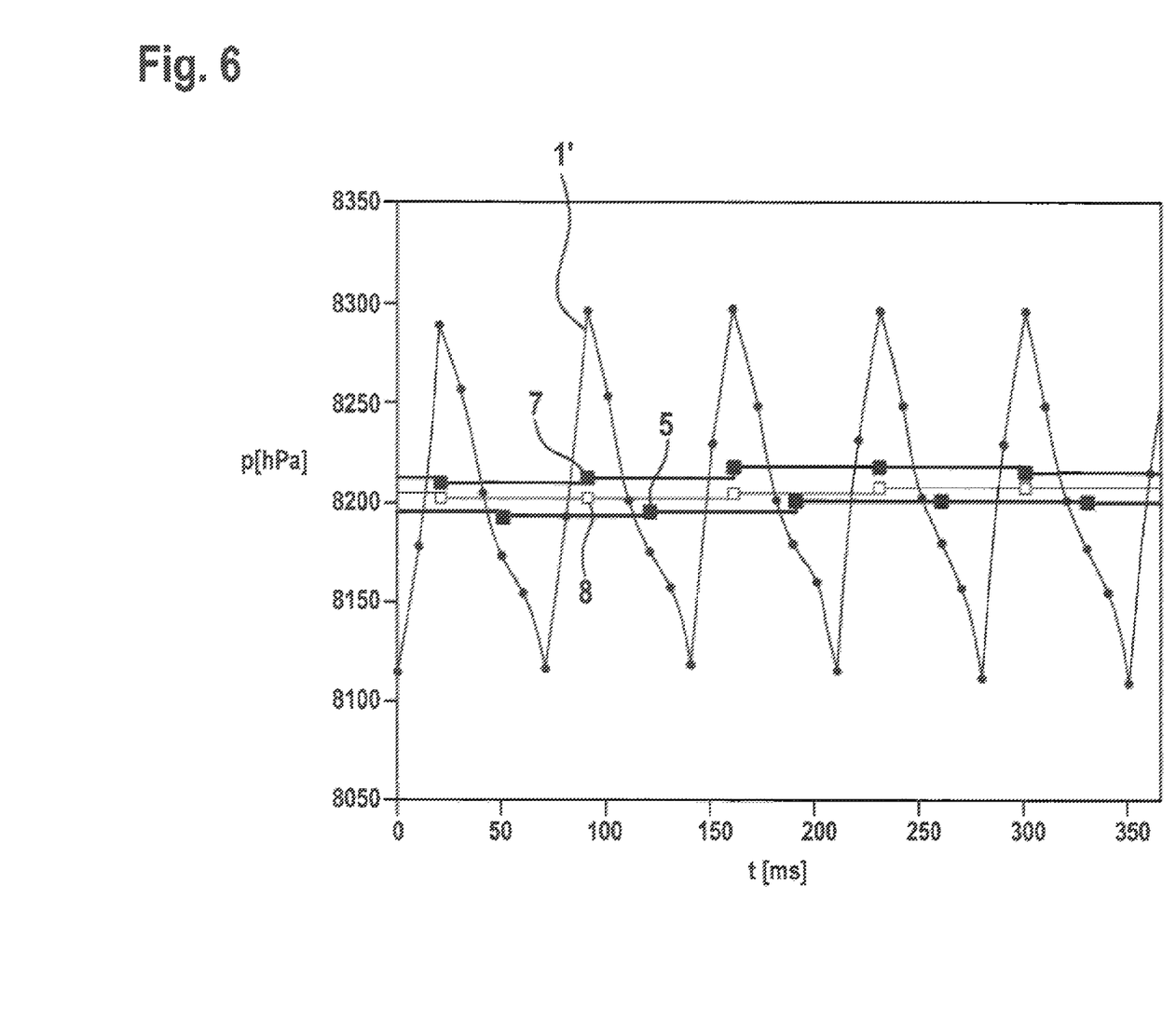
FIG. 6 shows, in a diagram of the pressure as a function of time, average values according to the first embodiment of the method according to the invention from FIG. 3 and average values according to the second embodiment of the method according to the invention from FIG. 5, as well as averaging of the average values according to one embodiment of the method according to the invention.

FIG. 6 shows, for the same system as in FIG. 1, measurement values 1' for the pressure p as a function of time, which has been determined time-discretely with a sampling rate of 10 ms. Within a period of the pulsation, in this exemplary embodiment only seven measurement values 1' were recorded. With such a small number of measurement values 1' within a period—less than 10 measurement values per period—time errors occur to an increased extent. In this embodiment of the method according to the invention, both the average values 5 for the intersection points 4 of the decreasing first signal 2 were determined by means of the first embodiment, which is described in FIGS. 2 and 3, and the average values 7 for the intersection points 6 of the increasing first signal 2 were determined by means of the second embodiment, which is described in FIGS. 4 and 5. It is to be noted that the two periodic average values 5 and 7 differ significantly from one another. In this embodiment, a common average value 8 is formed by taking the arithmetic mean of the two periodic average values 5 and 7. In this exemplary embodiment, the common average value 8 is determined simultaneously with the determination of the periodic average values 7 for the intersection points 6 of the increasing first signal 2, and takes into account the respectively new average value 7 for the intersection points 6 of the increasing first signal 2 and the preceding average value 5 for the intersection points 4 of the decreasing first signal 2.

Figure 7:
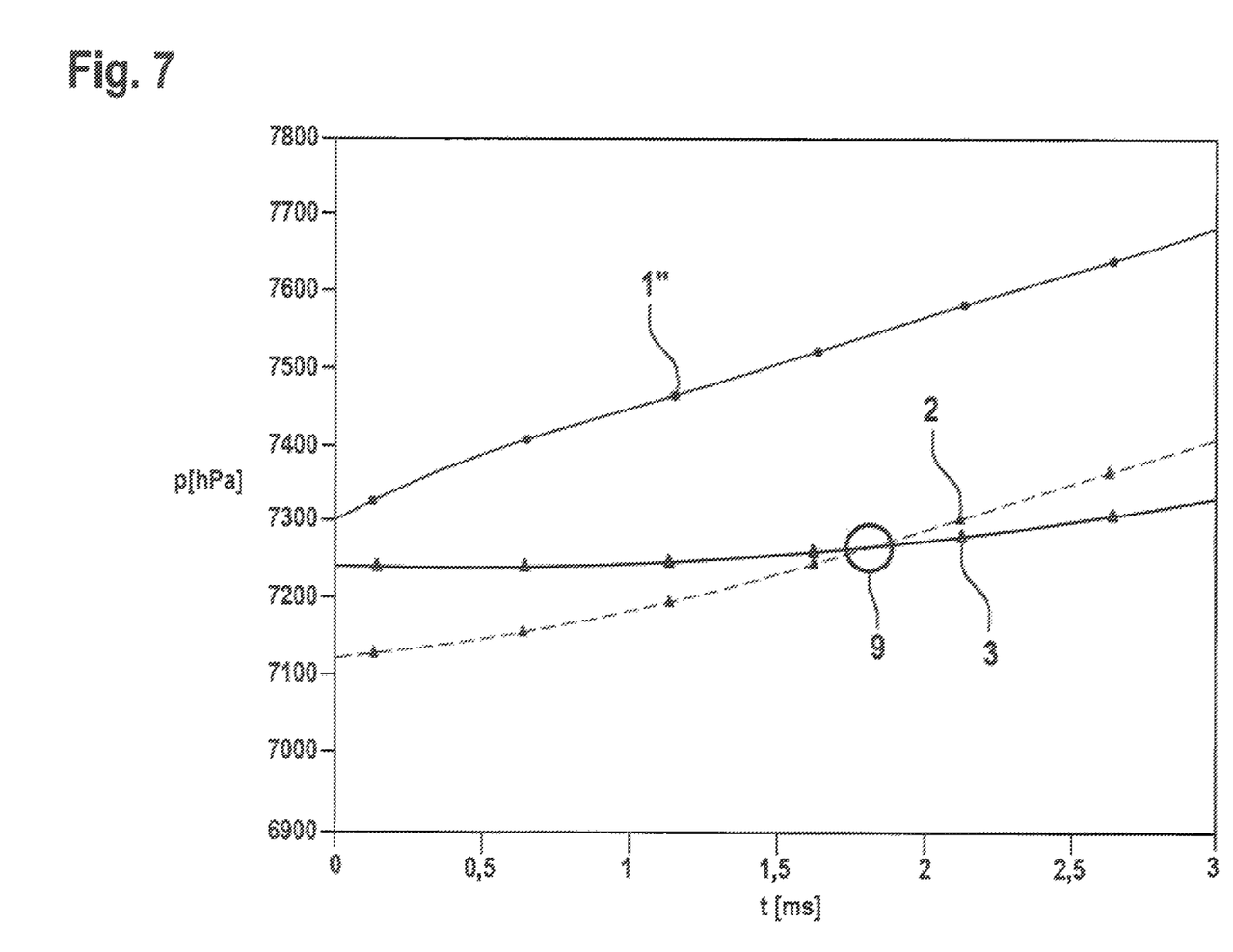
FIG. 7 shows a diagram of measurement values and of a first and a second filtered signal of a pressure as a measurement quantity as a function of time, an interpolation of the signals being carried out and intersection points being determined by means of the interpolated signals.

FIG. 7 shows a further exemplary embodiment of the method according to the invention in a diagram of the pressure p as a function of time t, which may also be applied when only a few measurement values 1" have been recorded within a period. In this embodiment, a linear interpolation of the first signal 2 and of the second signal 3 is carried out, i.e. theoretical values of the two signals 2 and 3, respectively, are calculated by means of a linear function between the signal values determined during the respective filtering, and the two signals 2 and 3 are thereby filled out. FIG. 7 shows an intersection point 9 which has been determined from the interpolated signals 2 and 3. By using the intersection points 9 determined by means of interpolation, the time error is reduced and the period $T_P$ can be determined more accurately.

Furthermore, a time error may lead to an error in the periodic average values 5, 7. This error in the periodic average values 5, 7 may, according to one exemplary embodiment, be minimized by interpolation of the average values 5, 7.

A fault or perturbation in the membrane pump is detected when, in the case of neighboring average values 5, 7, 8 determined in the same way, in the steady-state case one of the two average values 5, 7, 8 lies outside a predetermined value range around the respective other average value 5, 7, 8.

Figure 8:
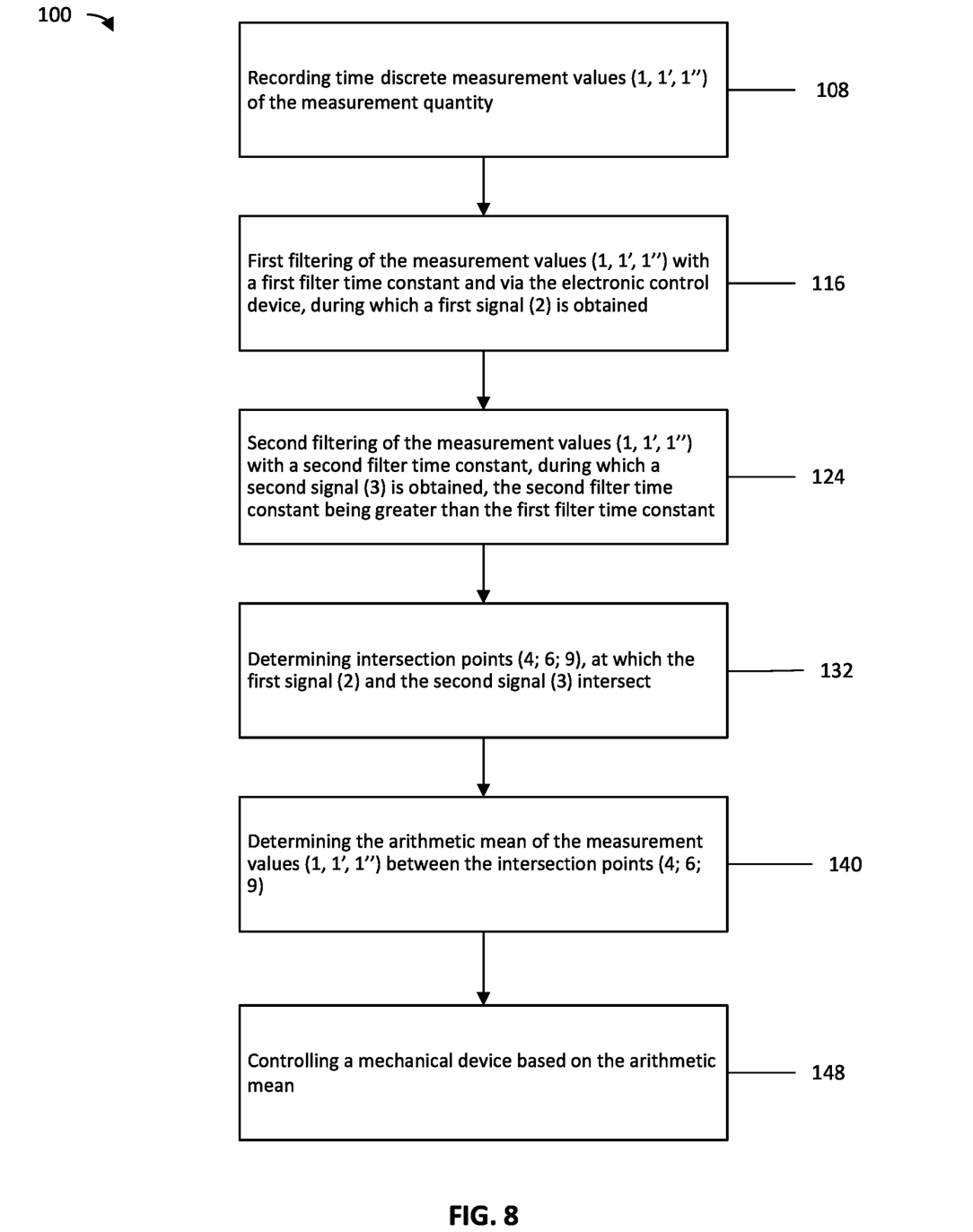
FIG. 8 shows a flow chart of a method for controlling a pump.

FIG. 8 shows a flowchart 100 for a method for averaging pulsating measurement quantities, such as pressure as shown in FIG. 1. The method comprises a step 108 of recording, via an electronic control device 60, time-discrete measurement values (1, 1', 1") of the measurement quantity. Thereafter, the electronic control device 60 advances to a filtering step 116 that includes a first filtering of the measurement values (1, 1', 1") with a first filter time constant and via the electronic control device 60, during which a first signal (2) is obtained.

The electronic control device 60 advances to a second filtering step 124 that filters the measurement values (1, 1', 1") with a second filter time constant, during which a second signal (3) is obtained. The second filter time constant is greater than the first filter time constant. The electronic control device 60 advances to a determining step 132. At the determining step 132, intersection points (4; 6; 9), at which the first signal (2) and the second signal (3) intersect are determined.

The electronic control device 60 advances to determining step 140, wherein the arithmetic mean of the measurement values (1, 1', 1") between the intersection points (4; 6; 9) is determined. Thereafter, the electronic control device 60 advances to controlling step step 148, for controlling a mechanical device, such as diaphragm pump 54, based on the arithmetic mean.

The invention claimed is:

1. A method for averaging pulsating measurement quantities to regulate a pump, the method comprising:
   recording, via an electronic control device, time-discrete measurement values (1, 1', 1") of the measurement quantity,
   first filtering of the measurement values (1, 1', 1") with a first filter time constant and via the electronic control device, during which a first signal (2) is obtained;
   second filtering of the measurement values (1, 1', 1") with a second filter time constant and via the electronic control device, during which a second signal (3) is obtained, the second filter time constant being greater than the first filter time constant;
   determining, via the electronic control device, intersection points (4; 6; 9), at which the first signal (2) and the second signal (3) intersect, wherein the time difference between neighboring intersection points (4; 6; 9) corresponds to a period $T_p$ of pulsation;
   regulating the pump by means of the period $T_p$ and/or rotational speed;
   determining, via the electronic control device, the arithmetic mean of the measurement values (1, 1', 1") between the intersection points (4; 6; 9); and
   detecting a fault or perturbation in the pump.

2. The method according to claim 1, wherein only intersection points (4) at which the first signal (2) is decreasing and intersects the second signal (3) are determined.

3. The method according to claim 1, wherein only intersection points (6) at which the first signal (2) is increasing and intersects the second signal (3) are determined.

4. The method according to claim 1, wherein averaging is carried out between average values (5) of the intersection points at which the first signal (2) is decreasing and average values (7) of the intersection points at which the first signal (2) is increasing, and the fault or perturbation is detected when, in the case of neighboring average values (5, 7) determined in a same way, one of the two average values (5, 7) lies outside a predetermined value range around the respective other average value (5, 7).

5. The method according to claim 1, wherein at least ten measurement values (1) during a pulsation of the measurement quantity are recorded during the recording of the time-discrete measurement values (1).

6. The method according to claim 1, wherein a linear interpolation of the first signal (2) and the second signal (3) is carried out during the determination of the intersection points (9).

7. The method according to claim 1, wherein the cutoff frequency of the first filtering is about two times the frequency of the pulsation of the measurement quantity.

8. The method according to claim 1, wherein the second filter time constant is approximately four times the first filter time constant.

9. A non-transitory computer-readable medium containing a computer program that when executed by an electronic control device causes the electronic control device to detect a fault or perturbation for a pump, the electronic control device configured to:
   record time-discrete measurement values (1, 1', 1") of a measurement quantity,
   first filter the measurement values (1, 1', 1") with a first filter time constant, during which a first signal (2) is obtained;
   second filter the measurement values (1, 1', 1") with a second filter time constant, during which a second signal (3) is obtained, the second filter time constant being greater than the first filter time constant;
   determine intersection points (4; 6; 9), at which the first signal (2) and the second signal (3) intersect, wherein the time difference between neighboring intersection points (4; 6; 9) corresponds to a period $T_p$ of pulsation;
   regulate the pump by means of the period $T_p$ and/or rotational speed;
   determine the arithmetic mean of the measurement values (1, 1', 1") between the intersection points (4; 6; 9); and
   average between the average values (5) of the intersection points at which the first signal (2) is decreasing and the average values (7) of the intersection points at which the first signal (2) is increasing, and
   detect a fault or perturbation in the pump when, in the case of neighboring average values (5, 7) determined in a same way, one of the two average values (5, 7) lies outside a predetermined value range around the respective other average value (5, 7).

10. An electronic control device, which is adapted to average a pulsating measurement quantity by means of a method according to claim 1.

11. The electronic control device according to claim 10, wherein the time-discrete measurement values (1, 1', 1") include pressure values.

12. The electronic control device according to claim 10, wherein the pump comprises a diaphragm pump.

13. The method according to claim 1, wherein the time-discrete measurement values (1, 1', 1") include pressure values.

14. The method according to claim 1, wherein the pump comprises a diaphragm pump.

15. The method according to claim 14, wherein the time-discrete measurement values (1, 1', 1") include pressure values.

16. A method for averaging pulsating measurement quantities to regulate a rotating component, the method comprising:
   recording, via an electronic control device, time-discrete pressure values (1, 1', 1") of pressure,
   first filtering of the pressure values (1, 1', 1") with a first filter time constant and via the electronic control device, during which a first signal (2) is obtained;
   second filtering of the pressure values (1, 1', 1") with a second filter time constant and via the electronic control device, during which a second signal (3) is obtained, the second filter time constant being greater than the first filter time constant;
   determining, via the electronic control device, intersection points (4; 6; 9), at which the first signal (2) and the second signal (3) intersect, wherein the time difference between neighboring intersection points (4; 6; 9) corresponds to a period $T_p$ of pulsation;
   determining a rotational speed from an inverse of the period $T_p$; and
   regulating the rotating component.

17. The method according to claim 16, wherein the rotating component comprises a pump.

18. The method according to claim 17, wherein the pump comprises a diaphragm pump.

19. The method according to claim 17, wherein the pump is part of a delivery and dosing system.

20. The non-transitory computer-readable medium according to claim 9, wherein the time-discrete measurement values (1, 1', 1") include pressure values.

* * * * *